United States Patent
Cranford, Jr. et al.

(10) Patent No.: US 6,977,558 B2
(45) Date of Patent: Dec. 20, 2005

(54) SELF-ADAPTIVE VOLTAGE REGULATOR FOR A PHASE-LOCKED LOOP

(75) Inventors: Hayden C. Cranford, Jr., Cary, NC (US); Stacy J. Garvin, Durham, NC (US); Vernon R. Norman, Cary, NC (US); Todd M. Rasmus, Cary, NC (US); Peter R. Seidel, Morrisville, NC (US)

(73) Assignee: International Busines Machines Corporation, Armonk, NY (US)

( * ) Notice: Subject to any disclaimer, the term of this patent is extended or adjusted under 35 U.S.C. 154(b) by 60 days.

(21) Appl. No.: 10/650,396

(22) Filed: Aug. 28, 2003

(65) Prior Publication Data

US 2005/0046489 A1    Mar. 3, 2005

(51) Int. Cl.[7] ............................................. H03L 7/14
(52) U.S. Cl. ................................. 331/186; 327/540
(58) Field of Search ........................ 331/17, 16, 185, 331/186, 34; 327/530, 540, 548, 156

(56) References Cited

U.S. PATENT DOCUMENTS

| | | | |
|---|---|---|---|
| 3,921,092 A | 11/1975 | Schatz | 331/1 |
| 4,346,343 A | 8/1982 | Berndlmaier et al. | 323/282 |
| 5,144,156 A | 9/1992 | Kawasaki | 307/262 |
| 5,359,300 A | 10/1994 | Minami | 331/17 |
| 5,576,657 A | 11/1996 | Frisch et al. | 327/543 |
| 5,748,044 A | 5/1998 | Xue | 331/2 |
| 5,889,438 A * | 3/1999 | Yamaguchi | 331/17 |
| 5,909,150 A | 6/1999 | Kostelnik et al. | 331/34 |
| 5,949,289 A * | 9/1999 | Smith et al. | 331/8 |

FOREIGN PATENT DOCUMENTS

JP          5136693          6/1993

* cited by examiner

*Primary Examiner*—Joseph Chang
(74) *Attorney, Agent, or Firm*—Sawyer Law Group LLP

(57) ABSTRACT

A self-adaptive voltage regulator for a phase-locked loop is disclosed. The phase-locked loop includes a phase detector, a charge pump, a low pass filter, and a voltage control oscillator, wherein the low pass filter inputs a control voltage to a voltage controlled oscillator for generation of an output clock. According to the method and system disclosed herein, the self-adaptive voltage regulator is coupled to an output of the low pass filter for sensing the control voltage during normal operation of the phase-locked loop, and for dynamically adjusting the supply voltage, which is input to the voltage controlled oscillator in response to the control voltage, such that the phase-locked loop maintains the control voltage within a predefined range of a reference voltage.

13 Claims, 3 Drawing Sheets

220'

SELF-ADAPTIVE VOLTAGE REGULATOR FOR A PHASE-LOCKED LOOP

FIELD OF THE INVENTION

The present invention relates to phase-locked loops, and more particularly to a self-adaptive voltage regulator for a phase-locked loop.

BACKGROUND OF THE INVENTION

Referring to FIG. 1, a block diagram illustrating a conventional phase-locked loop is shown. A conventional phase-locked loop (PLL) 10 is a feedback loop that includes a phase detector 14, which receives a reference clock 12 as one input, a charge pump (CP) 16, and a low pass filter 18 that provides a control voltage (VC) 20 to a voltage controlled oscillator (VCO) 22 for generation of an output clock 24. The clock 24 output by the VCO is feedback into the phase detector 14 through an optional divider 26, which frequency multiplies the output clock up.

The function of the PLL 10 is to lock the output of the VCO 20 to the phase of the reference clock 12. In operation, the phase detector 14 compares the phase of the incoming reference clock 12 with the divided frequency of the VCO output clock 24, and produces an output that is a function of the phase difference. This output from the phase detector 14 is used to control which direction the charge pump 16 charges/discharges the low pass filter 18 to produce a control voltage 20 frequency that has a reduced phase difference. The control voltage 20, in turn, controls the frequency of the VCO 22. This loop forms a negative feedback system. For the loop to achieve phase lock, the phase of the input reference clock 12 and the divided VCO output 24 must have a fixed phase relationship (ideally 0 degrees difference).

Temperature/process variations can cause problems for timing critical circuits, such as the PLL 10. To insure the PLL loop can null the effects of process/temperature changes, the control voltage 20 changes to control the VCO 22 frequency, and thus the output clock phase position, in such a way that this fixed phase relationship with the reference clock 12 is maintained. More particularly, as process/temperature drifts occur, the VC 20 changes in the direction that will yield zero phase difference between the input reference clock 12 and the divided VCO output 24. For example, a temperature change or slow process may slow down the VCO 22. In this case, the VC 20 voltage will need to move lower to speed up the VCO 22 and keep the loop locked (i.e., zero phase difference). However, although moving the VC 20 away from its center position helps insure the PLL loop will maintain lock, higher output clock jitter (i.e., unwanted phase movement) can result. Ideally, the control voltage 20 should operate within a particular voltage range for best output jitter performance.

Thus, it is desirable to both maintain PLL phase lock AND maintain the control voltage 20 at some predefined optimal voltage position for lowest jitter. Moreover, it would be desirable to have an error control signal that dynamically adjusts the voltage of the VCO 22 or other delay sensitive circuits/paths as the process/temperature changes.

Digital sampling or logic control may be implemented to account for process/temperature drift. For example, one approach utilizes a dual loop system where the PLL feedback acts as a fast loop and a slow loop is added to the PLL loop to slowly change the gain of the VCO 22 to keep the PLL loop running at the proper frequency. This slow loop only operates at power-up to determine the proper operating frequency.

Although digital sampling may account for process/temperature drift, it suffers several disadvantages. The main disadvantage of digital sampling is that it only works at power up to set the proper state of the regulator output, and there is only a limited number of output states that can be chosen to center the control voltage. This is done because it is undesirable to change the control voltage 20 with finite granularity as that will both cause abrupt changes in the output phase of the VCO 22, which is a source of jitter that needs to be avoided.

Accordingly, what is needed is a method and system for minimizing operational frequency limitations of a phase-locked loop by maintaining the control voltage at an optimal position as temperature/process changes occur during normal operation of the PLL. The present invention addresses such a need.

SUMMARY OF THE INVENTION

The present invention provides a method and system for providing a phase-locked loop with self-adaptive voltage regulator. The phase-locked loop includes a phase detector, a charge pump, a low pass filter, and a voltage control oscillator, wherein the low pass filter inputs a control voltage to the voltage controlled oscillator for generation of an output clock. According to the method and system disclosed herein, a self-adaptive voltage regulator is coupled to an output of the low pass filter for sensing the control voltage during normal operation of the phase-locked loop, and for dynamically adjusting the supply voltage, which is input to the voltage controlled oscillator, in response to the control voltage, such that the phase-locked loop maintains the control voltage within a predefined range of a reference voltage.

According to the method and system disclosed herein, the voltage regulator of the present invention minimizes operational frequency limitations of a phase-locked loop by maintaining the control voltage at an optimal position as temperature/process changes occur during normal operation of the phase-locked loop.

DETAILED DESCRIPTION OF THE INVENTION

The present invention relates to minimizing frequency of phase-locked loops due to temperature/process variations. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a real-time sampling system for a phase-locked loop that dynamically controls a supply voltage input to the phase-locked loop in order to maintain an optimal control voltage position. This is accomplished by continually sensing the control voltage of the phase-locked loop during normal operation, comparing the control voltage to an optimal value, and dynamically adjusting the supply voltage using an analog technique in order to keep the control voltage within a predefined range of the optimal value.

In accordance with a preferred embodiment of the present invention, the real-time sampling system is implemented as an analog self-adaptive voltage regulator. When sampling the control voltage, the voltage regulator does not suffer the disadvantages of digital implementations that have limited sampling points or discrete operating conditions. In addition, the voltage regulator is capable of operating during normal steady-state conditions of the phase-locked loop. The present invention does not require digital sampling or logic control, and allows for granular control over a predetermined supply and PLL control voltage range. Accordingly, the real-time voltage regulator may be useful for extending the usable operating frequency of the phase-locked loop or extending the margin of delay critical circuits by nulling the limiting effects of process and temperature drift that occur during normal operation.

Figure 1:
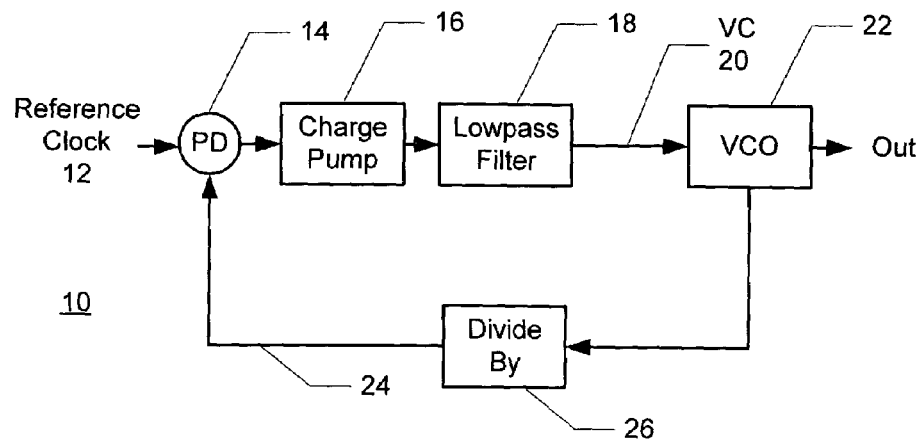
FIG. 1 is a block diagram illustrating a conventional phase-locked loop.
Figure 2:
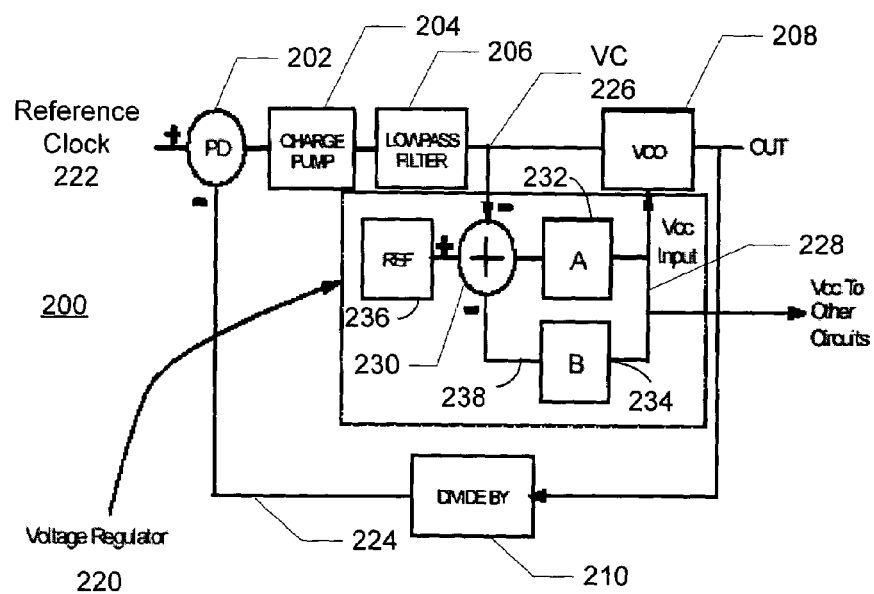
FIG. 2 is a block diagram illustrating a phase-locked loop having a self-adaptive voltage regulator in accordance with the preferred embodiment of the present invention.

Referring now to FIG. 2, a block diagram illustrating a phase-locked loop having a self-adaptive voltage regulator in accordance with the preferred embodiment of the present invention. As described with reference to FIG. 1, a phase-locked loop (PLL) 200 is a feedback loop comprising a phase detector 202, a charge pump 204, a low pass filter 206, a voltage control oscillator (VCO) 208 and an optional divide by circuit 210. According to the present invention, the PLL 200 is further provided with a self-adaptive voltage regulator 220, which forms a second negative feedback loop nested within the PLL 200.

In operation, the phase detector 202 receives a reference clock 222 as input and produces an output that is a function of the phase difference the reference clock 222 and the divided frequency of the VCO output clock 224. This output from the phase detector 202 is used to control which direction the charge pump 204 charges/discharges the low pass filter 206 to produce a control voltage 226 frequency that has a reduced phase difference and which controls the phase and frequency of the VCO 208. Adding charge for completing charge from the low pass filter 206 either increases or reduces the value of the control voltage 226 appropriately to speed up for slowdown the VCO 208.

The function of the voltage regulator 220 is to keep the control voltage 226 centered during normal operation of the PLL 200, not just a power-up, by continually adjusting its regulated output supply voltage 228 that is input to the VCO 208. More particularly, the self-adjusting voltage regulator 220 dynamically controls the regulated output supply voltage 228 connection to the VCO 208 by using the control voltage 226 from the PLL 200 as an error signal that is proportionate to process/temperature drift occurring in the PLL 200.

In a preferred embodiment, the voltage regulator 220 is a negative feedback loop comprising a summing node 230, a forward gain A 232, and a feedback gain B 234. The control voltage 226 output from the low pass filter 206 of the PLL 200 is input to the summing node 230. The summing node 230 continually samples the control voltage 226 and compares a weighted combination of the control voltage 226 and a feedback supply voltage 238 to a reference voltage 236 that represents an optimal value of the control voltage 226 to determine an amount of drift occurring in the PLL 200. In response, the regulated output supply voltage 228 from the regulator 220 is set such that the VCO 208 will cause the PLL 200 to shift the control voltage 226 towards the optimal value (reference voltage 236). Thus, voltage regulator 220 ensures that the control voltage 226 remains centered during operation of the PLL 200.

The forward gain A 232 multiplies the difference between summing node voltage 230 and the reference voltage 236 by a gain amount "A" to output the supply voltage 228. The supply voltage 228 is also input to feedback gain B 234, which multiplies the supply voltage 228 by a continuation value "B", normally some fraction of the output. Loop gain B outputs a feedback supply voltage 238 to the summing node 230 that represents a value proportional to the current output supply voltage 228. The summing node 230 looks for an error in the output against some ideal by outputting the difference between the reference voltage 236 and the weighted sum of the control voltage 226 and feedback supply voltage 238.

During operation of the PLL 200, the VCO 208 process may drift slower due to temperature variation, or example. To compensate, the output of the low pass filter 206 will tend to decrease in order to decrease the control voltage 226 and speed up the VCO 208 to maintain lock. This decrease will be sensed by the self-adaptive regulator 220 as it compares the control voltage 226 to the reference voltage 236 and the feedback supply voltage 238. When it is determined that the control voltage 226 is less than the reference voltage 236, the self-adaptive regulator 220 attempts to increase the control voltage 226 back into its optimal position by increasing the regulated supply voltage 228 input to the VCO 208, thus speeding up the output frequency. In response, the control voltage 226 returns towards its original (optimal) position, while the regulator output supply voltage 228 remains higher, thus nulling out the effects of the slower process.

Similarly, if the VCO 208 process drifts faster, the output of the low pass filter 206 will increase in order to increase the control voltage 226 and slowdown the VCO 208. The self-adaptive regulator 220 will sense this increase. When it is determined that the control voltage 226 is greater than the reference voltage 236, the self-adaptive regulator 220 attempts to decrease the control voltage 226 back into its optimal position by decreasing the regulator output supply voltage 228 that is input to the VCO 208, thus slowing down the output frequency. In response, the control voltage 226 returns towards its optimal position.

Thus, the PLL 200 of the present invention uses two feedback loops to maintain PLL phase lock—the normal PLL feedback loop, and the regulator control feedback loop. Ideally, the regulator control feedback controls the "DC" response (for slow changes), while the normal PLL feedback controls the "AC" response (time domain movement in the input reference clock 222).

Figure 3:
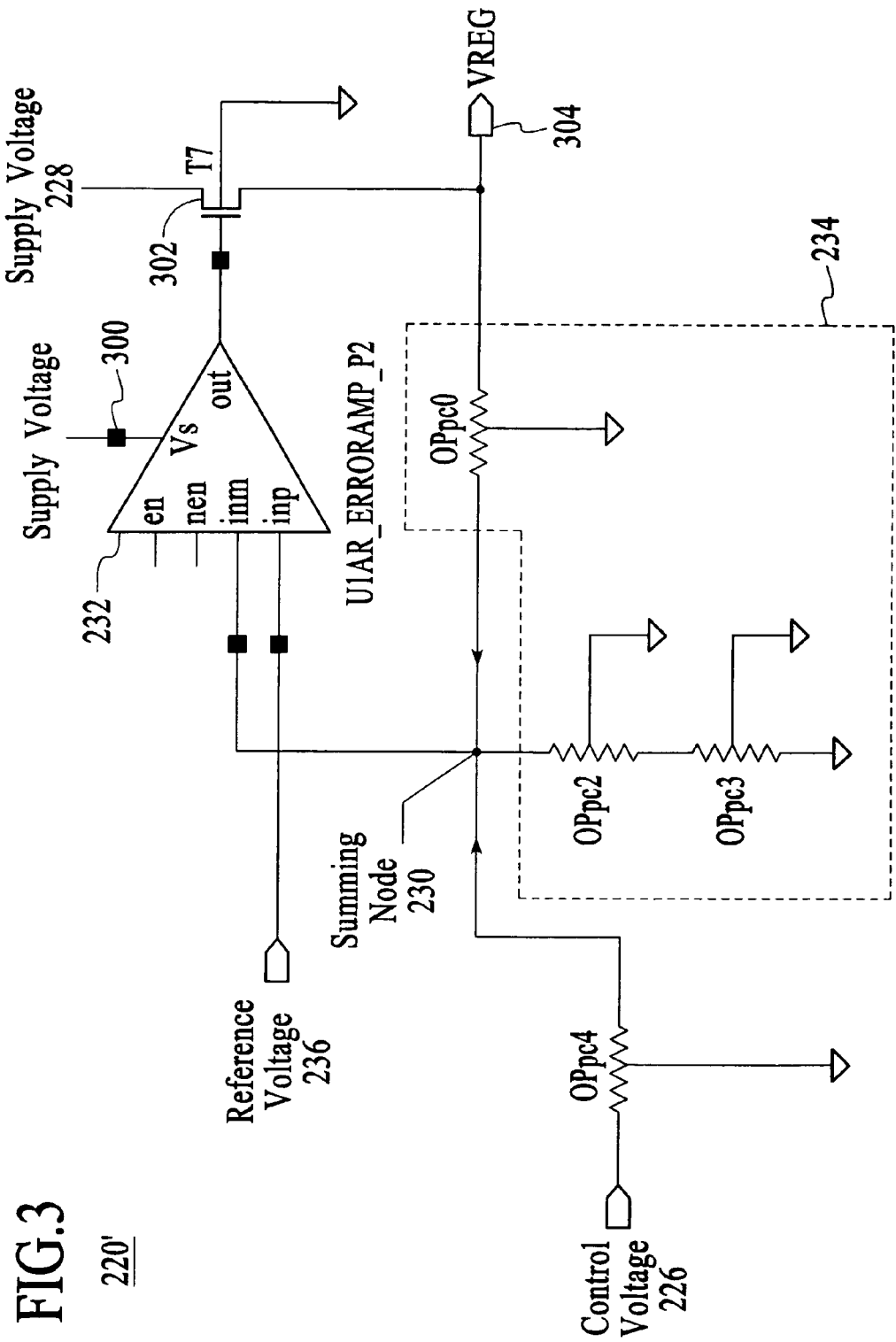
FIG. 3 is a block diagram illustrating one embodiment of the self-adaptive voltage regulator shown in FIG. 2.

FIG. 3 is block diagram illustrating one embodiment of the self-adaptive voltage regulator 220 shown in FIG. 2. In a preferred embodiment, the regulator 220' includes four resistors, OPpc0, OPpc2, OPpc3, and OPpc4. The control voltage 226, which is used as an error control signal from the PLL 200, is input through resistor OPpc0 to the summing node 230. Resistors OPpc2, OPpc3, and OPpc4 form feedback gain B 234, the output of which is also input to the summing node 230. The output of the summing node 230 is input to forward gain A 232 along with the reference voltage 236, which is an on-chip static voltage reference that is temperature and supply compensated. Vsupply 300 is input to the forward gain A 232 and is a power supply voltage that powers the voltage regulator 220'. The forward gain A 232 multiples the difference between the reference voltage 236 and the output of the summing mode 230 to produce the regulated output supply voltage 228.

Figure 4:
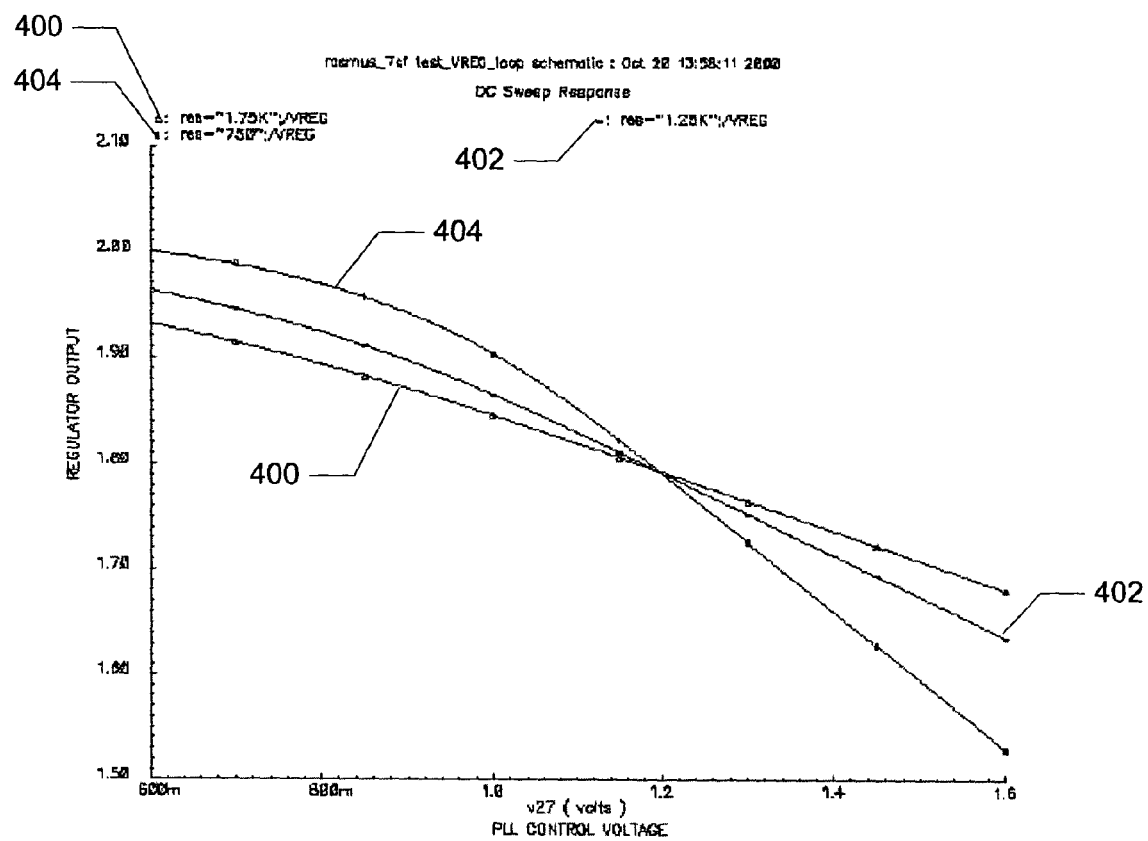
FIG. 4 is a graph depicting the output of the regulator circuit shown in FIG. 3.

The gain of the self-adaptive voltage regulator 212' can be changed by varying the values of the resistors OPpc0, OPpc2, OPpc3, and especially OPpc4, as illustrated in FIG. 4.

FIG. 4 is a graph depicting the output of the regulator circuit shown in FIG. 3 for different values of resistor OPpc4. The control voltage error signal is plotted on the x-axis, while the supply voltage 228 output by the voltage regulator 220' is plotted on the y-axis. Three curves are shown, each with a different value of OPpc4. Curve 400 represents the DC sweep response when OPpc4 has a value of 1.75K. Curve 402 represents the DC sweep response when OPpc4 has a value of 1.25K. And curve 404 represents the DC sweep response when OPpc4 has a value of 750K.

The slope of each curve is determined by the ratio of OPpc4 and OPpc0. The steeper the curve, the more compressed the VCO control range becomes. The intersection of the three curves, 1.2V and 1.8V, represents the nominal environment for the PLL 200. This means that the PLL 200 should be designed such that at a nominal temperature and with a nominal process, the control voltage 226 for a nominal frequency would be 1.2V. This intersection is determined by the reference voltage 236 and the ratio of the sum OPpc2 and OPpc3 to OPpc0. Therefore, by altering the resistor values in FIG. 3, varying slopes and intersection points can be had. The selection of OPpc0, OPpc2, OPpc3, and OPpc4 are to be considered during the design process and selection of particular values does not limit the invention to those values.

A PLL having an analog self-adaptive regulator has been disclosed that adjusts a supply voltage input to the PLL in real-time in order to keep a PLL control voltage centered during operation of the PLL.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A phase-locked loop, comprising:
a phase detector, a charge pump coupled to the phase detector, a low pass filter coupled to the charge pump, and a voltage control oscillator coupled to the charge pump and a supply voltage, wherein the low pass filter inputs a control voltage to the voltage controlled oscillator for generation of an output clock; and
a voltage regulator coupled to an output of the low pass filter, the voltage regulator for sensing the control voltage during normal operation of the phase-locked loop, and for dynamically adjusting the supply voltage in response to the control voltage, wherein the voltage control regulator uses the control voltage as an error signal that is proportionate to process/temperature drift occurring in the phases locked loop such that the phase-locked loop maintains the control voltage within a predefined range of a reference voltage regulator comprising,
a summing node for continually sensing the control voltage and for comparing a combination of the control voltage and a current output of the voltage regulator to the reference voltage to determine an amount of drift occurring in the phase-locked loop;
a first loop gain for multiplying an output from the summing node to generate the supply voltage that is input to the voltage control oscillator; and
a second loop gain for multiplying the supply voltage by a continuation value to create a feedback voltage and for inputting the feedback voltage to the summing node as the current output of the voltage regulator,
wherein in response to control voltage changes the supply voltage is set such that the voltage control oscillator will cause the phase-locked loop to shift the control voltage towards the reference voltage thereby compensating the phase-locked loop for temperature/process drift.

2. The regulator of claim 1 wherein the control voltage is input to the summing node through a first resistor.

3. The regulator of claim 2 wherein the second loop gain comprises second, third, and fourth resistors.

4. The regulator of claim 3 wherein the gain of the self-adaptive voltage control is altered by changing the values of the resistors.

5. The phase-locked loop of claim 4 wherein the phase-locked loop further includes:
a divider coupled between the voltage control oscillator and the phase detector for frequency multiplying the output clock up, thereby forming a first feedback loop.

6. The phase-locked loop of claim 5 wherein the voltage regulator forms a second feedback loop nested within the first feedback loop of the phase-locked loop.

7. A method for minimizing operational frequency limitations of a phase-locked loop, comprising:
(a) coupling an analog voltage regulator to the phase-locked loop, wherein the voltage regulator receives a control voltage from the phase-locked loop and outputs a supply voltage to a voltage control oscillator of the phase-locked loop;
(b) continually sensing the control voltage during normal operation of the phase-locked loop by
(i) continually sensing the control voltage and the supply voltage; and
(ii) comparing the reference voltage to a weighted sum of the control voltage and the supply voltage to determine an amount of drift occurring in the phase-locked loop; and
(c) dynamically adjusting the supply voltage in response to the control voltage by increasing the supply voltage when the control voltage is less than the reference voltage and decreasing the supply voltage when the control voltage is greater than the reference voltage, such that the phase-locked loop maintains the control voltage within a predefined range of a reference voltage.

8. The method of claim 7 wherein the voltage control regulator uses the control voltage as an error signal that is proportionate to process/temperature drift occurring in the phases locked loop.

9. The method of claim 8 further including the step of implementing the phase-locked loop as a first feedback loop, and implementing the voltage regulator as a second feedback loop nested within the first feedback loop of the phase-locked loop.

10. A self-adaptive voltage regulator for use with a phase-locked loop, wherein the phase-locked loop includes phase detector, a charge pump coupled to the phase detector, a low pass filter coupled to the charge pump, and a voltage control oscillator coupled to the charge pump, wherein the low pass filter inputs a control voltage to a voltage controlled oscillator for generation of an output clock, the self-adaptive voltage regulator comprising:
  a summing node for continually sensing the control voltage and for comparing a combination of the control voltage and a current output of the self-adaptive voltage regulator to a reference voltage to determine an amount of drift occurring in the phase-locked loop;
  a first forward gain for multiplying an output from the summing node to generate a supply voltage that is input to the voltage control oscillator; and
  a second feedback gain for multiplying the supply voltage by a continuation value and inputting the multiplied value to the summing node as the current output of the voltage regulator,
  wherein, in response to control voltage changes, the supply voltage is set such that the voltage control oscillator will cause the phase-locked loop to shift the control voltage towards the reference voltage, thereby compensating the phase-locked loop for temperature/process drift.

11. The regulator of claim 10 wherein the control voltage is input to the summing node through a first resistor.

12. The regulator of claim 11 wherein the second loop gain comprises second, third, and fourth resistors.

13. The regulator of claim 12 wherein the gain of the self-adaptive voltage control is altered by changing the values of the resistors.

* * * * *

UNITED STATES PATENT AND TRADEMARK OFFICE
CERTIFICATE OF CORRECTION

| | |
|---|---|
| PATENT NO. | : 6,977,558 B2 |
| APPLICATION NO. | : 10/650396 |
| DATED | : December 20, 2005 |
| INVENTOR(S) | : Cranford, Jr. et al. |

Page 1 of 1

It is certified that error appears in the above-identified patent and that said Letters Patent is hereby corrected as shown below:

In column 6, line 2, add --, the voltage--, after "voltage".

Signed and Sealed this

Fifteenth Day of August, 2006

JON W. DUDAS
*Director of the United States Patent and Trademark Office*